US008854088B2

(12) United States Patent
Jeong

(10) Patent No.: US 8,854,088 B2
(45) Date of Patent: Oct. 7, 2014

(54) MULTI-CHIP SYSTEM AND SEMICONDUCTOR PACKAGE

(71) Applicant: SK hynix Inc., Gyeonggi-do (KR)

(72) Inventor: Chun-Seok Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/841,114

(22) Filed: Mar. 15, 2013

(65) Prior Publication Data

US 2014/0139269 A1    May 22, 2014

(30) Foreign Application Priority Data

Nov. 22, 2012    (KR) .................. 10-2012-0132958

(51) Int. Cl.
*H03B 1/00* (2006.01)
*H03K 3/00* (2006.01)
*H03K 3/36* (2006.01)

(52) U.S. Cl.
CPC ..................................... *H03K 3/36* (2013.01)
USPC ........... 327/109; 327/108; 327/110; 327/111; 327/112

(58) Field of Classification Search
USPC .................................................. 327/108–112
See application file for complete search history.

(56) References Cited

U.S. PATENT DOCUMENTS

| 7,389,194 | B2 | | 6/2008 | Nguyen et al. | |
|---|---|---|---|---|---|
| 8,677,294 | B2 | * | 3/2014 | Nishioka et al. | 716/108 |
| 8,717,839 | B2 | * | 5/2014 | Yokou et al. | 365/201 |
| 2010/0270668 | A1 | * | 10/2010 | Marcoux | 257/690 |
| 2011/0260331 | A1 | * | 10/2011 | Lee | 257/774 |
| 2012/0066432 | A1 | * | 3/2012 | Miura | 711/102 |
| 2012/0286849 | A1 | * | 11/2012 | Lee et al. | 327/525 |
| 2013/0187677 | A1 | * | 7/2013 | Hsu et al. | 324/762.02 |
| 2014/0056086 | A1 | * | 2/2014 | Yoko et al. | 365/191 |
| 2014/0104920 | A1 | * | 4/2014 | Ikegami et al. | 365/66 |

FOREIGN PATENT DOCUMENTS

KR    1020110002281    1/2011

* cited by examiner

*Primary Examiner* — Adam Houston
(74) *Attorney, Agent, or Firm* — IP & T Group LLP

(57) ABSTRACT

A multi-chip system may include a plurality of chips, and a channel shared by the plurality of chips. At least one of the plurality of chips includes a transmission circuit configured to transmit a signal to the channel. Drivability of the transmission circuit is adjusted based on a number of the plurality of chips.

15 Claims, 7 Drawing Sheets

US 8,854,088 B2

MULTI-CHIP SYSTEM AND SEMICONDUCTOR PACKAGE

CROSS-REFERENCE TO RELATED APPLICATIONS

The present application claims priority of Korean Patent Application No. 10-2012-0132958, filed on Nov. 22, 2012, which is incorporated herein by reference in its entirety.

BACKGROUND

1. Field

Exemplary embodiments of the present invention relate to a system including a multi-chip and a semiconductor package, and more particularly, to improvement of signal characteristics on shared channel in a multi-chip system.

2. Description of the Related Art

Recently, capacities and speeds of semiconductor memories used as memory devices in most electronic systems tend to increase. Various attempts have been made to mount larger capacities of memories with efficient drivability in smaller size of the memories.

In order to improve the degree of integration of memories, a three-dimensional (3D) layout, which stacks a plurality of memory chips, has been adopted instead of a conventional two-dimensional (2D) layout. The 3D layout of memory chips may be a solution to increasing demand for higher degree of integration through larger capacity while reducing size of memories.

A TSV (through-silicon via) scheme as one of the 3D layout technology has been adopted as an alternative for overcoming various concerns in the 3D layout such as reduced transmission speed due to a distance between circuits on a module and a narrow data bandwidth. According to the TSV scheme, paths are defined to pass through a plurality of stacked memory chips and the memory chips communicate with each other through the paths and electrodes formed therein.

FIG. 1 illustrates a diagram illustrating a conventional package including a multi-chip.

Referring to FIG. 1, in the package, a plurality of chips 110 to 140 are stacked and a common channel 101 is formed using TSV through the stacked chips 110 to 140. The plurality of chips 110 to 140 include transmission circuits TX1 to TX4 and reception circuits RX1 to RX4, respectively. The transmission circuits TX1 to TX4 drive output signals or data to the reception circuits RX1 to RX4 through the channel 101. For example, the reception circuit RX1 of the chip 110 may receive a signal driven to the channel 101 by the transmission circuit TX4 of the chip 140, and the reception circuit RX4 of the chip 140 may receive a signal driven to the channel 101 by the transmission circuit TX1 of the chip 110.

The number of chips stacked in the multi-chip package may vary according to a memory design. The length and loading of the channel 101, which are dependent on the number of chips stacked in the multi-chip package, may influence signal characteristics thereon.

SUMMARY

Exemplary embodiments of the present invention are directed to provide a multi-chip system or a multi-chip package capable of preventing signal characteristics on a channel shared by a plurality of chips from varying due to the number of the chips in a multi-chip package or a multi-chip system.

In accordance with an embodiment of the present invention, a multi-chip system may include a plurality of chips, and a channel shared by the plurality of chips. Here, at least one of the plurality of chips includes a transmission circuit configured to transmit a signal to the channel, and wherein drivability of the transmission circuit is adjusted based on a number of the plurality of chips.

In accordance with another embodiment of the present invention, a multi-chip package may include a plurality of stacked chips, and a channel shared by the plurality of chips. Here, at least one of the plurality of chips may includes a transmission circuit configured to transmit a signal to the channel, and wherein drivability of the transmission circuit is adjusted based on a number of the plurality of chips.

In accordance with an embodiment of the present invention, drivability of chips for a channel are adjusted according to the number of chips sharing a channel in a multi-chip system or a multi-chip package, so that it is possible to prevent signal characteristics on the channel from varying due to the number of the chips.

DETAILED DESCRIPTION

Figure 1:
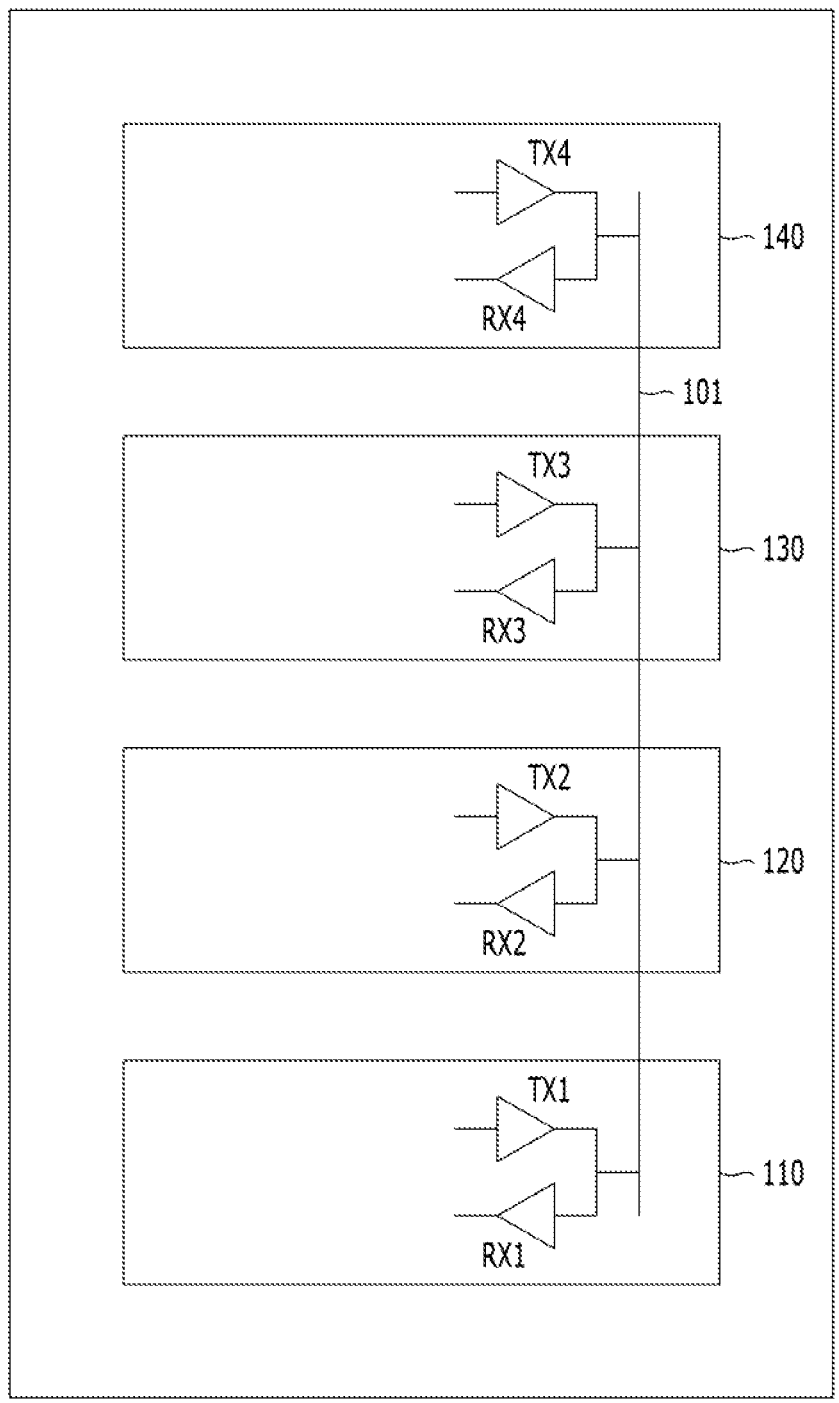
FIG. 1 is a diagram illustrating a conventional package including a multi-chip.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
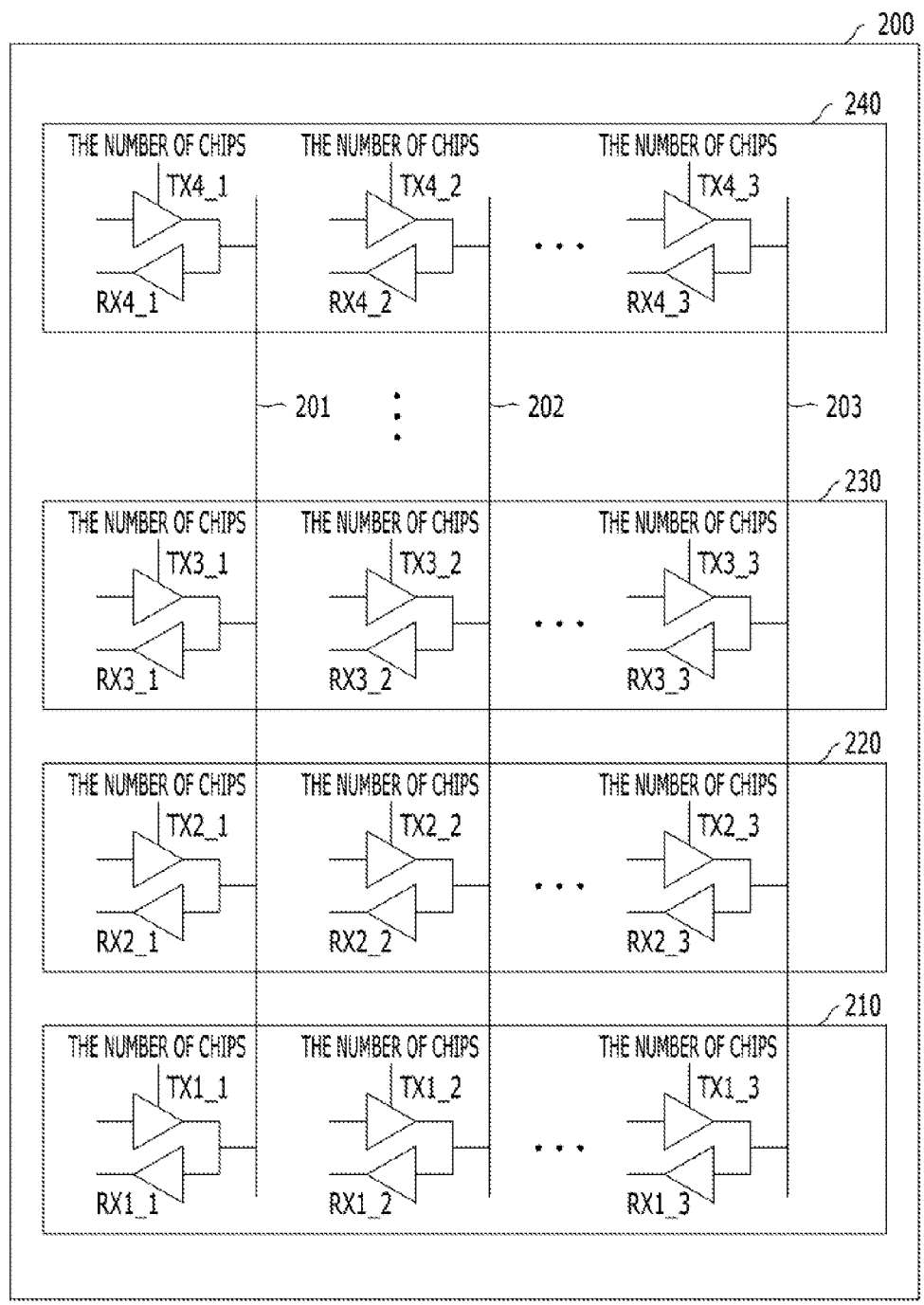
FIG. 2 is a configuration diagram illustrating a multi-chip package in accordance with an embodiment of the present invention.

FIG. 2 illustrates a configuration diagram of a multi-chip package in accordance with an embodiment of the present invention.

Referring to FIG. 2, a multi-chip package 200 includes a plurality of chips 210 to 240, and one or more channels 201 to 203.

The plurality of chips 210 to 240 are stacked in the package 200. The plurality of chips 210 to 240 may be homogeneous or heterogeneous. For example, one, part, or all of the plurality of chips 210 to 240 may be a memory chip(s) or a memory controller(s). The chip 210 may function as an interface with an exterior of the package 200 and the other chips 220 to 240 may be memory chips. The plurality of chips 210 to 240 may not be associated with a memory. No matter what kind of chip it is, the present invention covers the chips 210 to 240 sharing the channels 201 to 203. Among the stacked chips 210 to 240, the lowermost chip 210 may be a master and may function as an interface between an exterior of the package 200 and the other chips 220 to 240 serving as slaves.

The channels 201 to 203 allow the chips 210 to 240 to exchange signals with one another using transmission circuits TX1_1 to TX4_3 and reception circuits RX1_1 to RX4_3, which are provided in the chips 210 to 240, respectively. The channels 201 to 203 may be formed by TSV. The number of the channels may vary according to a memory design. Some chips may include either one of the transmission circuits or the reception circuits for the channels 201 to 203.

An increase of the number of chips 210 to 240 stacked in the package 200 cause increases of the lengths of the channels 201 to 203 as well as the number of transmission circuits TX1_1 to TX4_3 and reception circuits RX1_1 to RX4_3 connected to the channels 201 to 203, and thus increase of the loading of the channels 201 to 203. That is, the loading of the channels 201 to 203 depends on the number of chips 210 to 240 in the package 200. The increase in the loading of the channels 201 to 203 makes it the transition of signals difficult on the channels 201 to 203 from HIGH to LOW or from LOW to HIGH, which may result in the disturbance of high speed signal transmission.

In the embodiment of FIG. 2, drivability of the transmission circuits TX1_1 to TX4_3 are adjusted according to the number of chips 210 to 240 sharing the channels 201 to 203. As the number of chips 210 to 240 increases, the drivability of the transmission circuits TX1_1 to TX4_3 increase, so that it is possible to transmit signals through channels without distortion despite the presence of high loading of the channels. As the number of chips 210 to 240 become smaller, the drivability of the transmission circuits TX1_1 to TX4_3 are adjusted, it is possible to save power of the multi-chip package.

Figure 3:
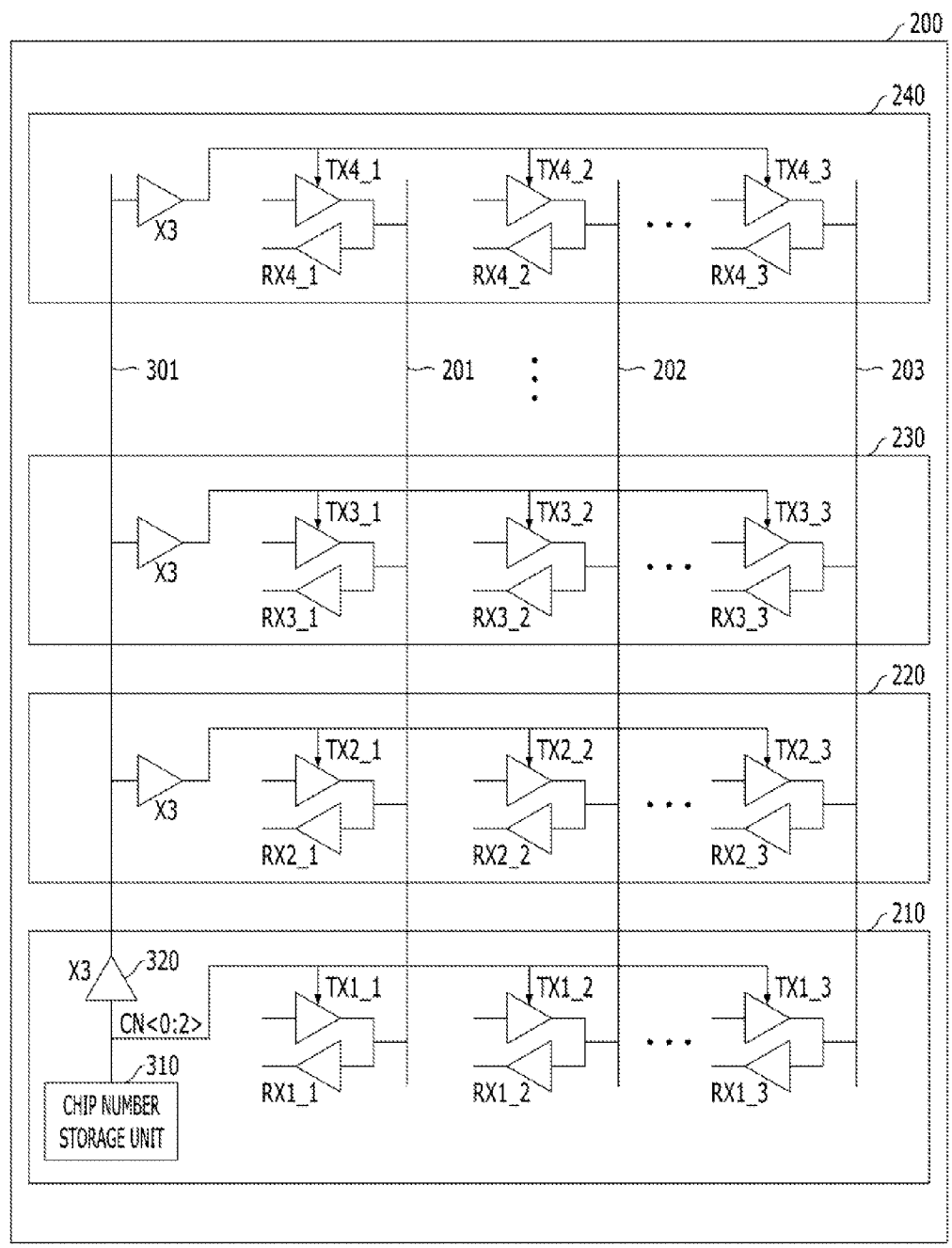
FIG. 3 is a detailed configuration diagram illustrating FIG. 2 in accordance with a first embodiment.

FIG. 3 illustrates a detailed configuration diagram of FIG. 2 in accordance with a first embodiment. In the first embodiment, information on the number of chips 210 to 240 in the package 200 is stored in one of the chips 210 to 240.

Referring to FIG. 3, the chip 210 includes a chip number storage unit 310. The chip number storage unit 310 may store a chip number code CN<0:2> in the form of a binary code, which indicates the number of chips in the package 200. The chip number storage unit 310 may be a nonvolatile memory, such as a fuse circuit. The chip number code CN<0:2> is transferred to the other chips 220 to 240 in the package 200 through a channel 301 for transmission of the chip number code CN<0:2>. The transmission circuits TX1_1 to TX4_3 of the chips 210 to 240 adjust their own drivability according to the chip number code CN<0:2>.

The number of bits of the chip number code may vary according to a memory design. The number of TSVs formed in the package 200 for the channel 301 and the number of transmission circuits 320 for transmission of the chip number code CN<0:2> depend on the number of bits of the chip number code CN<0:2>. The drivability of the transmission circuits 320 may be adjusted according to the chip number code CN<0:2> similar to those of the transmission circuits TX1_1 to TX4_3.

The chip number storage unit 310 may be provided in one of the chips 220 to 240 in the package 200. As another embodiment, each of the chips 210 to 240 may have the chip number storage unit 310 and adjust the drivability of its own transmission circuits TX1_1 to TX4_3 according to the chip number code CN<0:2> stored in the chip number storage unit 310 of its own.

Figure 4:
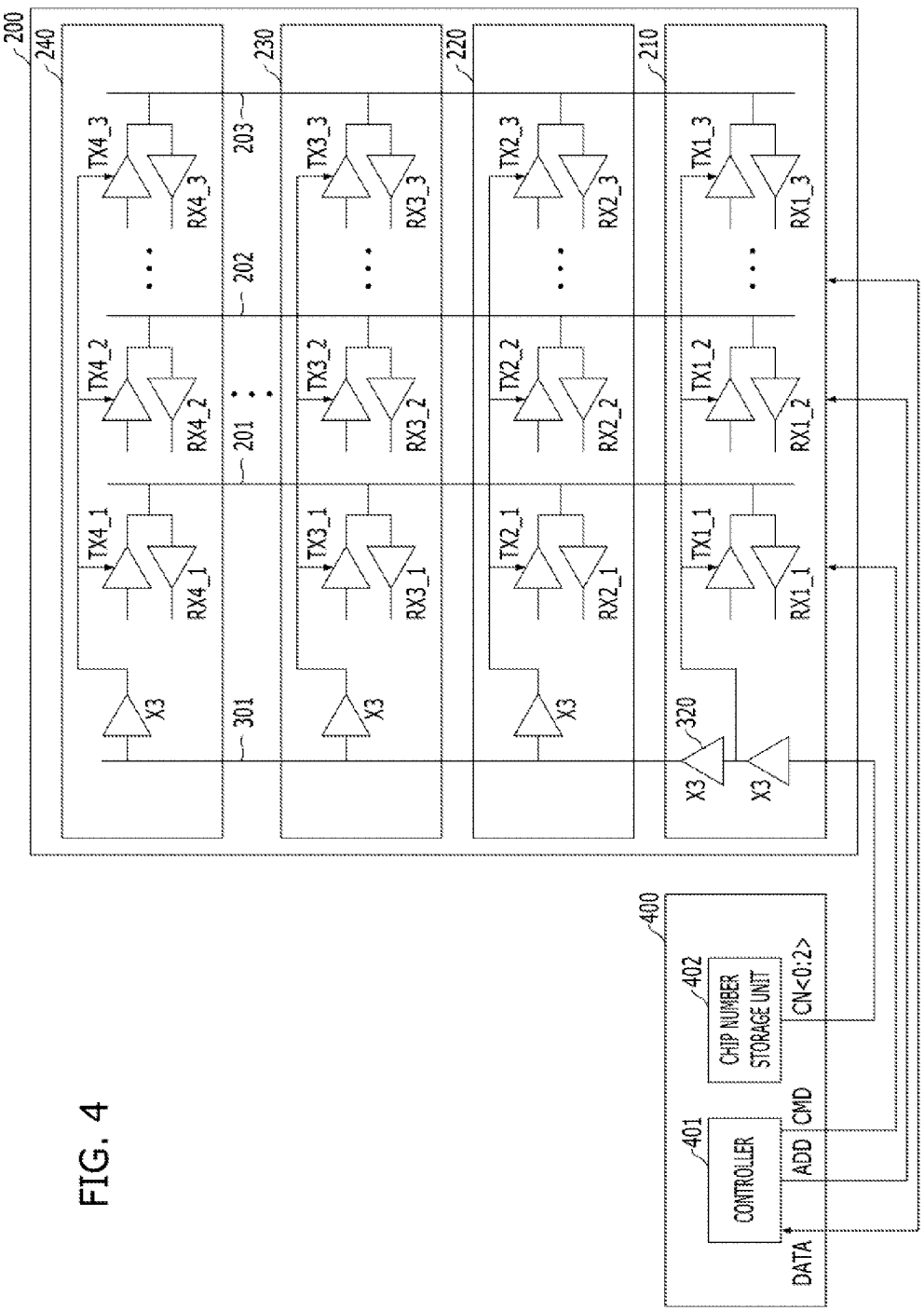
FIG. 4 is a detailed configuration diagram illustrating FIG. 2 in accordance with a second embodiment.

FIG. 4 illustrates a detailed configuration diagram of FIG. 2 in accordance with a second embodiment. In the second embodiment, the information on the number of chips 210 to 240 in the package 200 is stored in another chip 400 located outside of the package 200. For the purpose of convenience, it is assumed that the chips 210 to 240 in the package 200 are memory chips and the chip 400 located outside of the package 200 is a memory controller.

Referring to FIG. 4, a controller 401 in the memory controller 400 is configured to transfer a command CMD and an address ADD to the memory package 200, and exchange data DATA with the memory package 200. The command CMD may include active, precharge, read, write, refresh commands and the like, and the address ADD includes information for selecting one of the chips 210 to 240 in the memory package 200, which will follow the command CMD from the memory controller 400, and information for selecting an area in the selected chip. In a read operation, read data DATA is transferred from the memory package 200 to the memory controller 400, and in a write operation, write data DATA is transferred from the memory controller 400 to the memory package 200.

Among the chips 210 to 240 in the memory package 200, the lowermost chip 210, as a master, functions as a communication interface between the memory controller 400 and the other chips 220 to 240.

A chip number storage unit 402 in the memory controller 400 stores the chip number code CN<0:2> indicating the number of memory chips 210 to 240 stacked in the memory package 200. The memory chip 210 in the memory package 200 transfers the chip number code CN<0:2> from the memory controller 400 to the other chips 220 to 240. The transmission circuits TX1_1 to TX4_3 of the memory chips 210 to 240 adjust their own drivability according to the chip number code CN<0:2>.

The number of TSVs formed in the package 200 for the channel 301 and the number of transmission circuits 320 for transmission of the chip number code CN<0:2> depend on the number of bits of the chip number code CN<0:2>. The drivability of the transmission circuits 320 may be adjusted according to the chip number code CN<0:2> similar to those of the transmission circuits TX1_1 to TX4_3.

Figure 5:
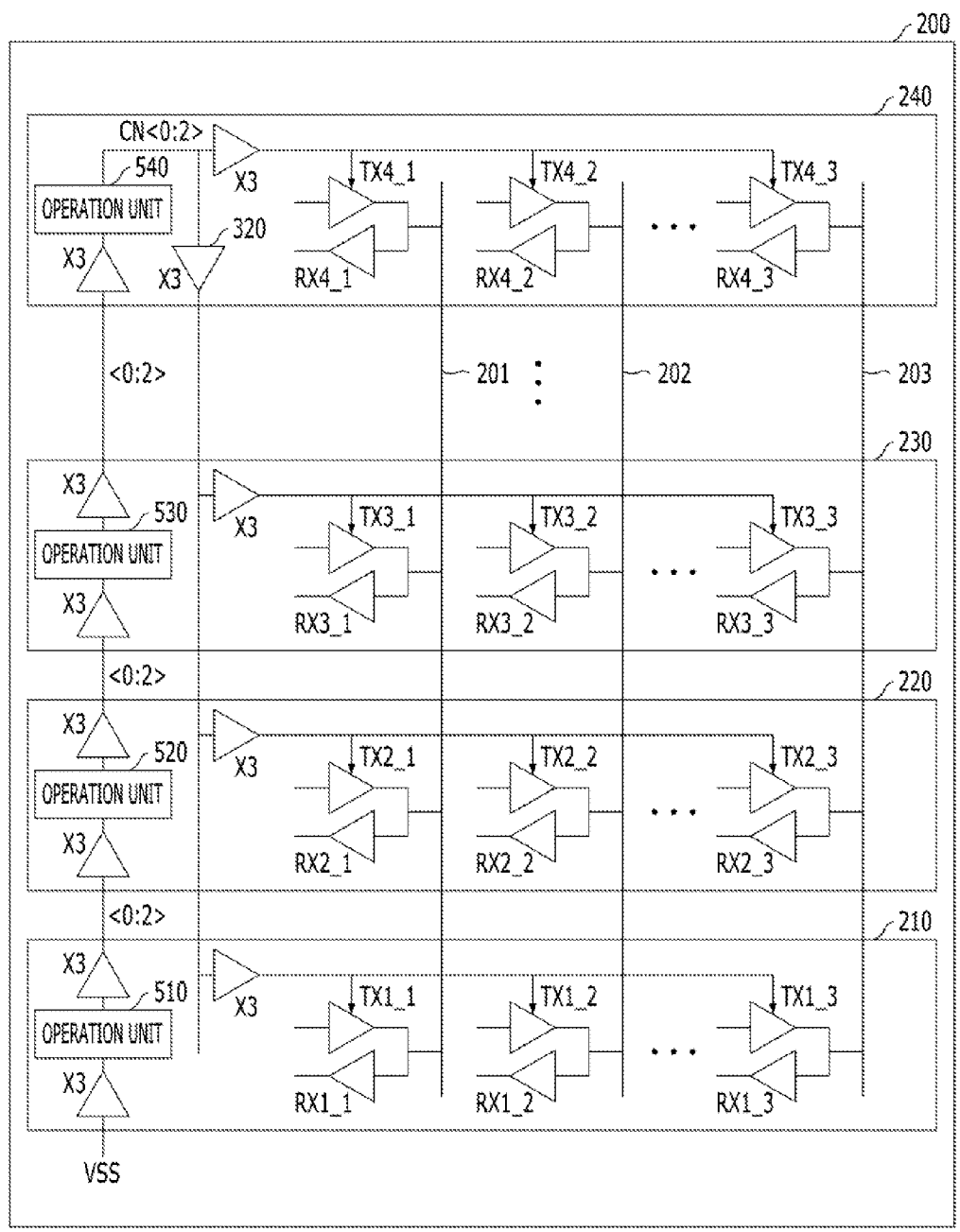
FIG. 5 is a detailed configuration diagram illustrating FIG. 2 in accordance with a third embodiment.

FIG. 5 illustrates a detailed configuration diagram of FIG. 2 in accordance with a third embodiment. In the third embodiment, the information on the number of chips 210 to 240 is generated by the chips 210 to 240.

Referring to FIG. 5, the chips 210 to 240 include operation units 510 to 540 for counting the number of chips 210 to 240, respectively. The operation units 510 to 540 are serially connected to one another, each of which adds 1 to a code value <0:2> received from a previous operation unit, and transfers a resultant value to a next operation unit. Among the operation units 510 to 540 serially connected to one another, the operation unit 510 of the first stage receives a code value of "000", which may be achieved by grounding the input of the operation unit 510 of the first stage. Among the operation units 510 to 540 serially connected to one another, a code value outputted from the operation unit 540 of the last stage is the chip number code CN<0:2> indicating total number of the chips 210 to 240.

The operations of the operation units 510 to 540 will be described below. The operation unit 510 adds 1 to the inputted code value of "000" and transfers a code <0:2> of "001" to the operation unit 520. The operation unit 520 adds 1 to the inputted code value of "001" and transfers a code <0:2> of "010" to the operation unit 530. When this process is repeated, a code outputted from the operation unit 540 of the last stage is the chip number code CN<0:2> indicating the number of chips 210 to 240 in the package 200.

The chip number code CN<0:2> generated in the operation unit 540 is transferred to all of the transmission circuits TX1_1 to TX4_3 of the chips 210 to 240 to adjust their own drivability according to the chip number code CN<0:2>. The channel 301 for transmission of the chip number code CN<0:2> may include TSVs that are substantially equal to the number of bits of the chip number code CN<0:2>. The number of transmission circuits 320 is also substantially equal to the number of bits of the chip number code CN<0:2>. The drivability of the transmission circuits 320 may be adjusted according to the code value of the chip number code CN<0:2> similar to those of the transmission circuits TX1_1 to TX4_3.

Figure 6:
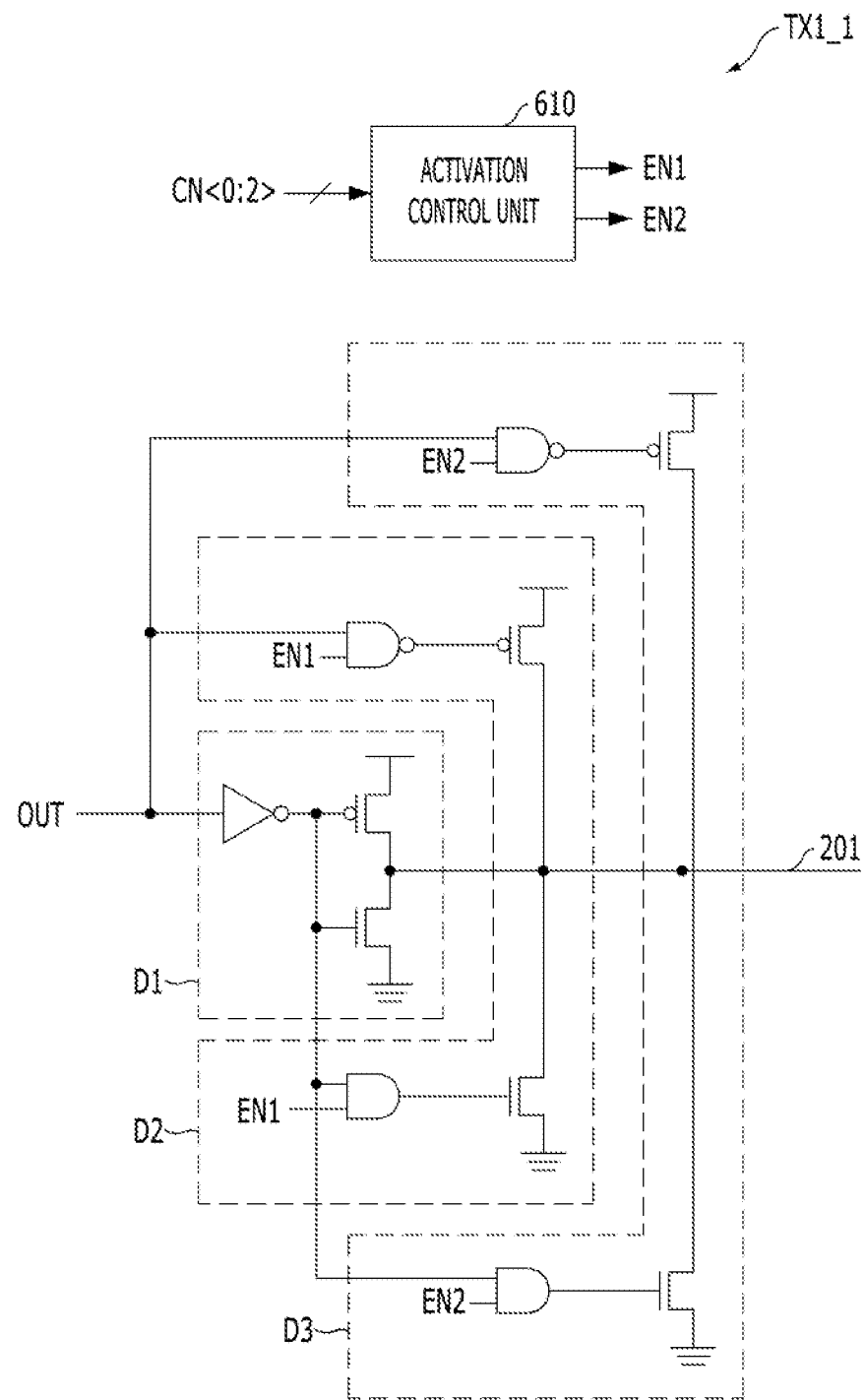
FIG. 6 is a circuit diagram illustrating transmission circuits shown in FIGS. 2 to 5 in accordance with an embodiment of the present invention.

FIG. 6 illustrates a circuit diagram of the transmission circuits TX1_1 to TX4_3 of FIGS. 2 to 5 in accordance with the embodiment of the present invention. FIG. 6 shows the transmission circuit TX1_1 that is substantially the same as the rest of the transmission circuits TX1_1 to TX4_3.

Referring to FIG. 6, the transmission circuit TX1_1 includes an activation control unit 610 and drivers D1 to D3.

The activation control unit 610 is configured to receive the chip number code CN<0:2> and to activate plural activation signals EN1 and EN2 according to the chip number code CN<0:2>. For example, the activation control unit 610 deactivates all the activation signals EN1 and EN2 if the package 200 includes one or two chips, activates the activation signal EN1 and deactivates the activation signal EN2 if the package 200 includes three to five chips, and activates all the activation signals EN1 and EN2 if the package 200 includes five or more chips. The number of the activation signals may vary according to a memory design.

The drivers D1 to D3 are configured to drive an output signal OUT to a channel 201 according to activation of the activation signals EN1 and EN2. The driver D1 drives the output signal OUT to the channel 201 regardless of the levels of the activation signals EN1 and EN2. The driver D2 drives the output signal OUT to the channel 201 under activation of the activation signal EN1. The driver D3 drives the output signal OUT to the channel 201 under activation of the activation signal EN2. The number of drivers depends on the number of the activation signals.

Since the activation control unit 610 activates a larger number of activation signals EN1 and EN2 as the number of chips 210 to 240 increases and the drivers D1 to D3 drive more of the output signal OUT to the channel 201 as the larger number of activation signals EN1 and EN2 are activated, the drivability of the transmission circuits TX1_1 to TX4_3 may be adjusted according to the number of chips 210 to 240.

It may be possible to design one activation control unit to be shared by a plurality of transmission circuits. For example, the transmission circuits TX1_1 to 3 in one chip 210 is able to share one activation control unit 610.

Figure 7:
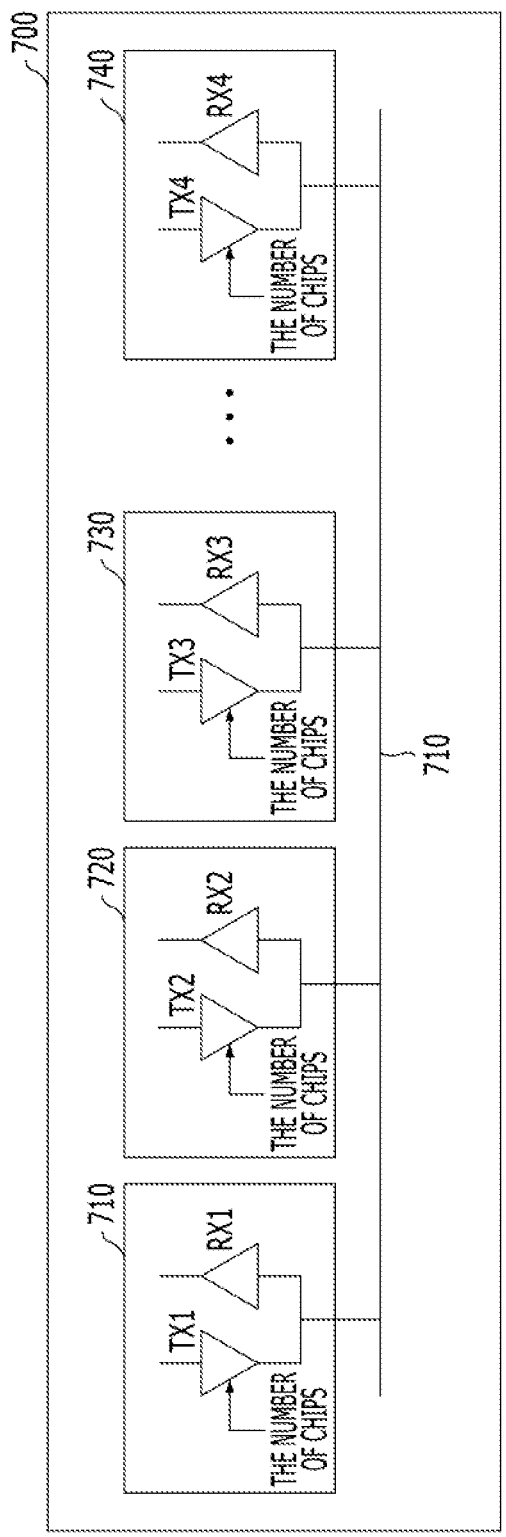
FIG. 7 is a configuration diagram illustrating a multi-chip circuit board in accordance with an embodiment of the present invention.

FIG. 7 illustrates a configuration diagram of a multi-chip circuit board in accordance with the embodiment of the present invention.

Referring to FIG. 7, the multi-chip circuit board includes a circuit board 700, a plurality of chips 710 to 740 on the board 700, and a channel 701 formed on the board 700.

Transmission circuits TX1 to TX4 and reception circuits RX1 to RX4 of the plurality of chips 710 to 740 exchange signals with one another through the channel 701. The channel 701 may be an interconnection formed on the board 700. As the number of chips 710 to 740 sharing the channel 701 increases, the length and loading of the channel 701 increases. Accordingly, the drivability of the transmission circuits TX1 to TX4 for the channel 701 may be adjusted according to the number of chips 710 to 740 sharing the channel 701.

The number of chips 710 to 740 sharing the channel 701 may be stored in one (for example, 710) of the chips 710 to 740 and transmitted to the other chips (720 to 740) similar to the embodiment illustrated in FIG. 3, or may be stored in another chip (not illustrated) outside the chips 710 to 740 and transmitted to the chips similarly to the embodiment illustrated in FIG. 4. Furthermore, similar to the embodiment illustrated in FIG. 5, operation units may be included in the chips 710 to 740, and the chips 710 to 740 may calculate the number of chips 710 to 740 by itself.

According to the embodiments as described above, the present invention may be applied among chips sharing a channel in a package, or applied among chips sharing a channel on a circuit board. In this way, the present invention may be applied to all types of multi-chip systems including chips sharing a channel.

While the present invention has been described with respect to the specific embodiments, it will be apparent to those skilled in the art that various changes and modifications may be made without departing from the spirit and scope of the invention as defined in the following claims.

What is claimed is:

1. A multi-chip system comprising:
a plurality of chips; and
a channel shared by the plurality of chips,
wherein at least one of the plurality of chips comprises a transmission circuit configured to transmit a signal to the channel, and
wherein drivability of the transmission circuit is adjusted based on a number of the plurality of chips.

2. The multi-chip system of claim 1, wherein information of the number of the plurality of chips is stored in the chip of the plurality of chips.

3. The multi-chip system of claim 1, wherein information of the number of the plurality of chips is stored in a control chip configured to control the multi-chip system, and transferred to the plurality of chips.

4. The multi-chip system of claim 1, wherein the drivability of the transmission circuit increases as the number of the plurality of chips increases, and is reduced as the number of the plurality of chips decreases.

5. The multi-chip system of claim 1, wherein each of the plurality of chips comprises:
an operation unit configured to count the number of chips,
wherein the operation units provided in the chips are serially connected to one another.

6. The multi-chip system of claim 5, wherein among the operation units serially connected to one another, an operation unit of a first stage is configured to receive an initial value, other operation units are configured to receive an output value of an operation unit of a previous stage, and the operation units are configured to output a value obtained by adding 1 to an inputted value.

7. The multi-chip system of claim 6, wherein among the operation units serially connected to one another, an output value of an operation unit of a last stage is the number of chips.

8. A multi-chip package comprising:
a plurality of stacked chips; and
a channel shared by the plurality of chips,
wherein at least one of the plurality of chips comprise a transmission circuit configured to transmit a signal to the channel, and
wherein drivability of the transmission circuit is adjusted based on a number of the plurality of chips.

9. The multi-chip package of claim 8, wherein information of the number of the plurality of chips is stored in the chip of the plurality of chips.

10. The multi-chip package of claim 8, wherein the plurality of chips are memory chips, the number of the plurality of chips is stored in a control controller chip, and information on the number of the plurality of chips is stored in the memory controller chip and transferred to the plurality of chips.

11. The multi-chip package of claim 8, wherein the drivability of the transmission circuit increases as the number of the plurality of chips increases, and is reduced as the number of the plurality of chips decreases.

12. The multi-chip package of claim 8, wherein each of the plurality of chips comprises:
an operation unit configured to count the number of chips, wherein the operation units provided in the chips are serially connected to one another.

13. The multi-chip package of claim 12, wherein among the operation units serially connected to one another, an operation unit of a first stage is configured to receive an initial value, other operation units are configured to receive an output value of an operation unit of a previous stage, and the operation units are configured to output a value obtained by adding 1 to an inputted value.

14. The multi-chip package of claim 13, wherein among the operation units serially connected to one another, an output value of an operation unit of a last stage is the number of chips and is transferred to each of the plurality of chips.

15. The multi-chip package of claim 8, wherein the transmission circuit comprises:
a plurality of drivers,
wherein among the plurality of drivers, a number of drivers to be activated is determined based on the number of the plurality of chips.

* * * * *